United States Patent
Huang

(10) Patent No.: US 6,646,521 B1
(45) Date of Patent: Nov. 11, 2003

(54) CONNECTION FOR CONDUCTING HIGH FREQUENCY SIGNAL BETWEEN A CIRCUIT AND A DISCRETE ELECTRIC COMPONENT

(75) Inventor: Guanghua Huang, Prior Lake, MN (US)

(73) Assignee: Hei, Inc., Victoria, MN (US)

( * ) Notice: Subject to any disclaimer, the term of this patent is extended or adjusted under 35 U.S.C. 154(b) by 0 days.

(21) Appl. No.: 09/662,186

(22) Filed: Sep. 15, 2000

(51) Int. Cl.[7] .................................................. H03H 7/38
(52) U.S. Cl. ........................................ 333/33; 333/247
(58) Field of Search ........................... 333/33, 246, 247; 257/728

(56) References Cited

U.S. PATENT DOCUMENTS

| | | | | |
|---|---|---|---|---|
| 5,777,528 A | * | 7/1998 | Schumacher et al. | 333/33 |
| 5,815,427 A | * | 9/1998 | Cloud et al. | 365/51 |
| 6,127,894 A | * | 10/2000 | Alderton | 330/286 |
| 6,201,454 B1 | * | 3/2001 | Kinayman et al. | 333/33 |
| 6,208,225 B1 | * | 3/2001 | Miller | 333/202 |
| 6,294,966 B1 | * | 9/2001 | Huang et al. | 333/33 |
| 6,399,894 B1 | * | 6/2002 | Albinsson et al. | 174/260 |

FOREIGN PATENT DOCUMENTS

| | | | | |
|---|---|---|---|---|
| EP | 0 772 234 A2 | | 5/1997 | |
| JP | 62-108577 | | 5/1987 | |
| JP | 404107940 A | * | 4/1992 | ........... H01L/21/60 |
| JP | 4-137739 | | 5/1992 | |

* cited by examiner

*Primary Examiner*—Robert Pascal
*Assistant Examiner*—Joseph Chang
(74) *Attorney, Agent, or Firm*—Merchant & Gould PC

(57) ABSTRACT

An apparatus for processing high frequency signals comprises a circuit board has a trace. An electrical circuit is fabricated on a die, which is mounted on the circuit board. The die has a top portion and a contact point is positioned on the top portion. The circuit is configured to process a signal having a frequency in the range of about 20 GHz and higher. A capacitor is mounted on the circuit board and has a top portion and bottom portion. The bottom portion opposes the trace. A wire extends between the contact point on the top portion of the die and the top portion of the capacitor. The wire has a length in the range of about 2 mils to about 12 mils.

41 Claims, 5 Drawing Sheets

FIG. 1A
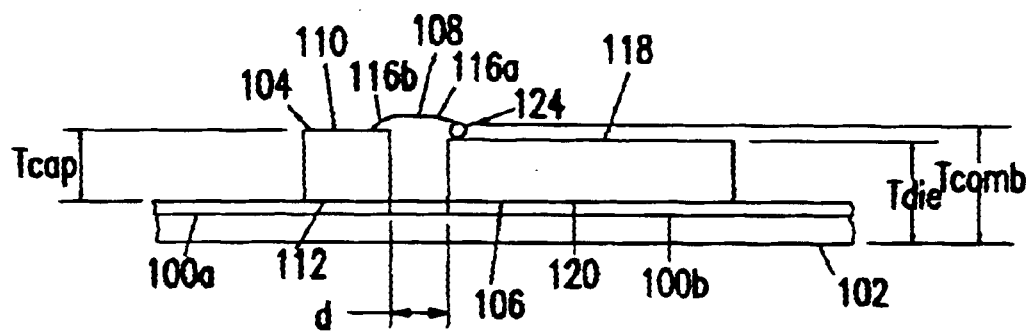
FIG. 1B
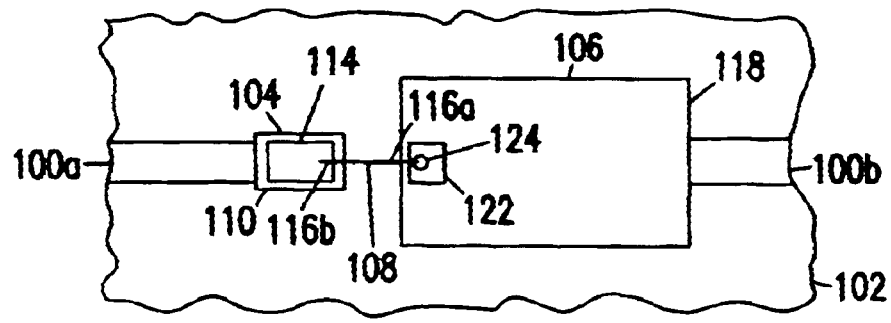
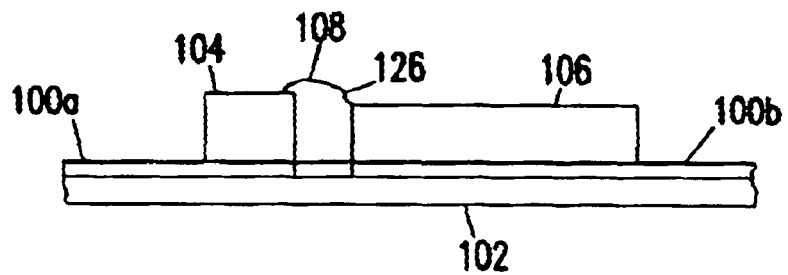
FIG. 2

Signal Loss v. Frequency

CONNECTION FOR CONDUCTING HIGH FREQUENCY SIGNAL BETWEEN A CIRCUIT AND A DISCRETE ELECTRIC COMPONENT

TECHNICAL FIELD

The present invention relates to a connection between a circuit and a discrete electrical component, and more particularly, to a connection for carrying a high frequency signal between a circuit and a discrete electrical component.

BACKGROUND

Technology for radio-frequency (RF) communications is developing at a very rapid pace. When the cellular telephone industry developed, for example, the telephones operated in the relatively low frequency range of 800 MHz to 900 MHz. Early cellular telephones and RF communication devices were also very large and bulky.

Communications technology has made great strides since these original cellular phone were developed and marketed. One improvement is the development of communication equipment that transmits at much higher frequencies, which has many advantages. One advantage of transmitting at high frequency is that the communication equipment can be made much smaller and cost effective.

Another advantage is that a high frequency signal can carry more information than a low frequency signal. This advantage is very important as both our society and economy become more dependent on information. Furthermore, communication devices are being used more and more to communicate data in addition to voice information. Examples of such devices that need to communicate massive amounts of data include cellular phones that provide wireless Internet access, wireless modems, and wireless network connections.

While high frequency RF communication has such strong advantages, there are some practical limitations to the ability to design circuitry that can effectively process an RF signal. One of the problems is that some portions of the signal path in many of the circuits are too long relative to the wavelength of the signal that is propagating along the path, which causes an excessive amount of degradation in the signal. For example, many electrical circuits and components are mounted on a wafer and cut into a die. The contact point or pad is usually on a top portion of the die. Additionally, the input and output of these signals are filtered through a capacitor that is mounted on the circuit board adjacent to the die. A wire is then positioned between a contact point or pad on top of the die and a trace or signal path printed on the circuit board.

However, the length of the wire required to reach from the top of the die to the trace on the surface of the circuit board is too long for very high frequency signals, especially those signals that have a frequency above 20 GHz. One phenomenon that results in degradation of such a signal is the impedance of the wire, which results in an inductance that opposes the flow of electrical current. If the wire is too long, the inductance is too great and results in signal loss and noise.

This problem is especially acute in dies that are relatively thick such as dies formed with silicon germanium (SiGe), which is otherwise advantageous because it is a very economical material to use when forming dies. Dies formed with SiGe are much thicker than those formed with gallium arsenide (GaAs), which is currently a more common material for forming dies. For example, the thickness of a SiGe die is about 10 mils and the thickness of a GaAs die is only about 2.5 mils. This extra thickness results in longer wires between the die and circuit board and thus more signal loss and noise in high frequency signals. Furthermore, because of the manufacturing process of building circuits, the wire gradually slopes down to the trace on the circuit board. Hence the wire becomes analogous to the hypotenuse of a triangle and has a length even longer than the depth of the die, which compounds the problem even more.

There are have been many different techniques to manufacture circuit boards that address these problems and either eliminate or minimize the length of the wire. One technique is to flip the die upside down to form a flip chip. The contact point of the die is then placed in direct electrical contact with the trace printed on the circuit board. Another technique is to have a recess or channel formed in the circuit board. The die is then mounted in the recess so that the top of the die is at about the same level as the trace printed on the circuit board.

However, all of these techniques introduce a new set of problems. For example, the flip chips are expensive to manufacture because of the difficulty in making a good solder contact point with the trace. Another problem with flip chips is that the dielectric characteristics of the circuit board will change the performance of the circuit or other electrical components mounted on the die. Using a circuit board that has channels is also very expensive to manufacture and thus is a poor choice for products that are price sensitive.

SUMMARY

In general terms, the present invention relates to the communication of a high-frequency signal from a die or similar structure to a discrete electrical component. One advantage of this invention is that it enables translation of an electrical signal off of a die or similar structure with a reduced distribute inductance of the signal path and hence a reduced degradation of the signal.

One aspect of the present invention is an apparatus for processing high frequency signals. The apparatus comprises an electrical circuit having a top portion and a contact point positioned on the top portion. A discrete electrical component also has a top portion and a contact point positioned on the top portion. An intermediate signal path extends between the contact point on the top portion of the electrical circuit and the contact point on the top portion of the discrete electrical component.

An alternative aspect of the present invention comprises a circuit board having a trace. An electrical circuit is fabricated on a die, which is mounted on the circuit board. The die has a top portion and a contact point is positioned on the top portion. The circuit is configured to process a signal having a frequency in the range of about 20 GHz and higher. A capacitor is mounted on the circuit board and has a top portion and bottom portion. The bottom portion opposes the trace. A wire extends between the contact point on the top portion of the die and the top portion of the capacitor. The wire has a length in the range of about 2 mils to about 12 mils.

Another alternative aspect of the invention comprises a circuit board that includes an electrical circuit and a discrete electrical component. A wire extends between the electrical circuit and the discrete electrical component. The wire does not have direct contact with the circuit board.

Yet another aspect of the present invention is a method of manufacturing electronics, the electronics being mounted on a circuit board having a surface. The method comprises mounting an electrical circuit to the circuit board, the electrical circuit having a contact point elevated off the surface of the circuit board; mounting a discrete electrical component on the circuit board, the discrete electrical component having a contact point elevated off the surface of the circuit board; and positioning a conductive path between the contact of the electrical circuit and the discrete electrical component.

Still another aspect of the present invention is a method of processing a high frequency electrical signal. The method comprises conducting the electrical signal through an electrical circuit, the electric circuit being mounted on a circuit board, the electrical signal having a frequency in the range of about 20 GHz and higher; directly conducting the electrical signal from the electrical circuit to a signal path at a contact point physically isolated from the circuit board; and directly conducting the electrical signal from the signal path to a discrete electrical component at a contact point physically isolated from the circuit board.

DESCRIPTION OF THE DRAWINGS

FIGS. 1A and 1B are a partial side view and a partial top view, respectively, of a circuit mounted on printed circuit board and embodying the present invention.

FIG. 2 is a partial side view of and alternative embodiment of the circuit illustrated in FIGS. 1A and 1B.

DETAILED DESCRIPTION

Figure 3:
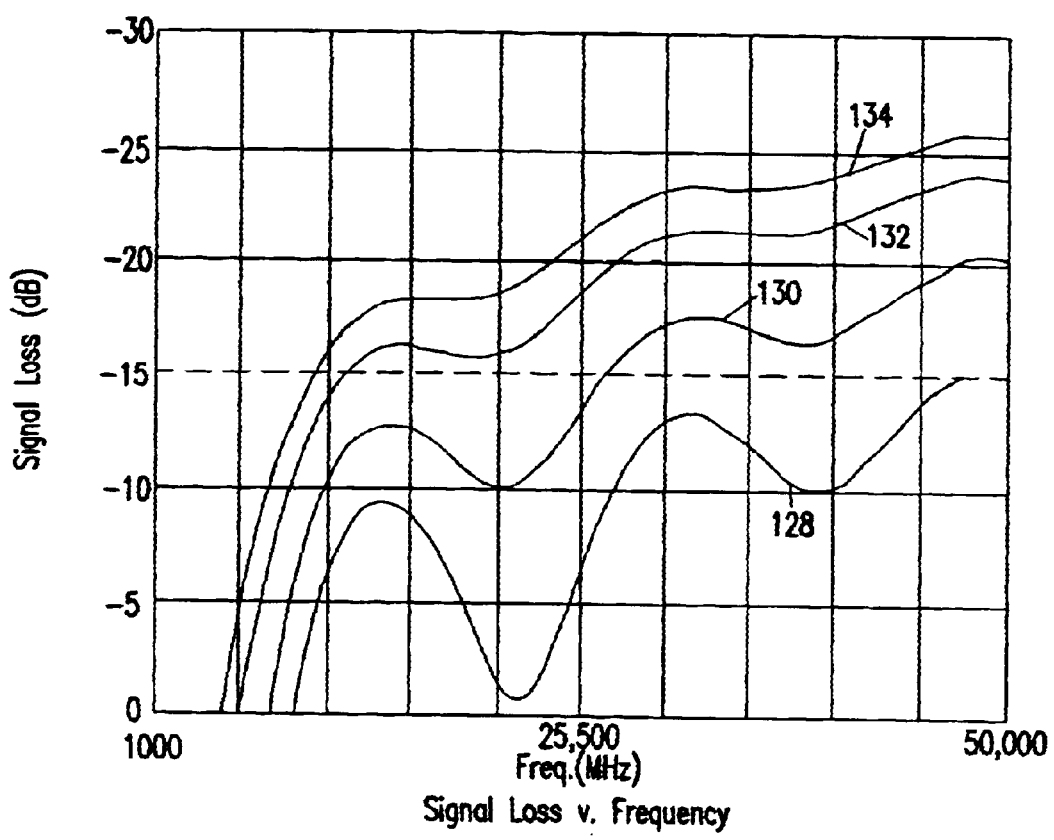
FIGS. 3–5 are graphs illustrating simulations that demonstrate performance of a circuit that embodies the present invention.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Referring now to FIGS. 1A and 1B, a plurality of signal traces, including traces 100*a* and 100*b*, are mounted on a circuit board 102. A discrete electrical component 104 is mounted on trace 100*a*, and a die 106 is mounted on the trace 100*b*. As explained in more detail herein, an intermediate signal path, such as a wire 108, provides electrical communication between the discrete electrical component 104 and the die 106.

In one possible embodiment, the distance d between the die 106 and the discrete electrical component 104 is in the range from about 2 mils to about 12 mils. In another possible embodiment, the distance d is about 3 mils. One advantage of minimizing the distance d is that it results in a minimal length of the intermediate signal path 108 and hence minimal degradation of a high frequency signal that is conducted along the intermediate signal path 108.

The discrete electrical component 104 can be one of several different devices and has a top portion 110 and a bottom portion 112. A first contact pad 114 or point is formed in the top portion 110 of the discrete electrical component 104 and a second contact point (not shown) is formed in the bottom portion 112 of the discrete electrical component.

In one possible embodiment, the discrete electrical component 104 is a block capacitor. One such capacitor that can be used is a 100 pF capacitor having a part number GH0158101kN6, which is commercially available from AVX Corporation of Myrtle Beach, S.C. This capacitor has a thickness $T_{cap}$ of about 7 mils. Although one particular type and size of capacitor is disclosed herein as an exemplary embodiment, other types and dimensions of capacitors can be used.

Other types of discrete electrical components can be used in place of capacitors. An example of another type of electrical components is a conductive member such as a metalized bar for establishing a path from the die to ground and a metalized chip for establishing a path from the die to a trace on the signal path. Such a structure does not materially contribute to distribute inductance in the signal path because they have a lance conductive area.

Additionally, one or more electrical components or a circuit, such as an integrated circuit, for processing a high-frequency signal are mounted on the die 106. The circuit can be configured to process a variety of different analog and digital signals including both high frequency modulated audio and data signals for use with wireless communications. An example of such a circuit is a monolithic microwave integrated circuit (MMIC).

The circuit processes signals having a frequency in the range of about 20 GHz and higher, although the precise bandwidth of the frequency that is processed will vary depending on the application. For example, some possible circuits process signals in the bandwidth of about 27 GHz to about 32 GHz for voice communication applications such as mobile telephones, signals in the bandwidth of about 32 GHz to about 38 GHz for digital radio applications, signals up to about 50 GHz for high-speed data communication, and signals at about 77 GHz for vehicle-mounted radar applications.

The dies 106 can be formed from a variety of different materials. Examples of such materials include silicon germanium (SiGe) and gallium arsenide (GaAs). The thickness $T_{die}$ of the die 106 will vary depending on the type of material and design of the die 106. For example, the thickness for many types of materials will be in the range of about 2 mils to about 10 mils. Additionally, the die 106 has a top portion 118 and a bottom portion 120. A contact pad 122 or point is positioned on the top portion 118 of the die 106.

Although the die 106 is disclosed as one possible exemplary embodiment, the present invention can be used for any type of circuit or electrical components for processing high frequency signals whether they are mounted on a die, a wafer, or a similar type of structure that has an electrical contact point elevated at a position above the structure's bottom portion 104 so that it will not be in direct electrical contact with the circuit board 102 to which the structure is mounted. Furthermore, the structure on which the electrical circuit or electrical components are mounted can be formed from any type of material, including SiGe and GaAs, suitable for mounting circuits and electrical components.

In an exemplary embodiment, the wire 108 between the die 106 and the discrete electrical component 104 is a round wire having first and second ends 116*a* and 116*b*. The first end 116a is bonded to the contact pad 122 on the top portion 118 of the die 106 and the second end 116b is bonded to the contact pad 114 on the top portion 110 of the discrete electrical component 104.

The first end 116a of the wire 108 is bonded to the contact pad 122 of the die 104 using a ball bond 124. In one possible embodiment, the combined thickness $T_{comb}$ of the ball bond 124 and the die 106 is about the same as the thickness of the discrete electrical component 104. As a result, the wire 108 is substantially parallel to the circuit board 102 and the length of the intermediate signal path 108 between the die 106 and the discrete electrical component 104 is minimized.

Other techniques for bonding a wire forming an intermediate signal path to the die are possible as well. For example, the wire can be bonded to the die using a wedge bond 126 as illustrated in FIG. 2. Additionally, the intermediate signal path can be a ribbon having a width that is greater than its thickness. Similar techniques are used to bond the second end 116b of the wire 108 to the discrete electrical component 104.

The wire 108 is substantially parallel to the circuit board when its length extends in about the same direction as the circuit board 102 to which the die 106 and discrete electrical component 104 are mounted; the wire 108 may have a slight curve and the first and second ends of the wire 108 may be slightly different distances from the circuit board. In one possible embodiment, the difference in the distance from the circuit board 102 to the first and second ends 116a and 116b of the intermediate signal path, is in the range from about 2 mils to about 12 mils. In yet another possible embodiment, the difference in the distance from the circuit board 102 to the first and second ends 116a and 116b, is in the range from about 2 mils to about 12 mils.

The following simulation and experimental results demonstrate the effectiveness and advantages of the invention set forth in the appended claims.

Simulation 1

FIG. 3 illustrates the performance of a wire connected to 50 Ω microstrips by different lengths of wire. The two 50 Ω microstrip lines were mounted or printed on a laminate substrate and electrically isolated. The microstrips were then connected using a wire having a diameter of 1 mil and lengths of 5 mils, 8, mils, 12 mils, and 15 mils. The wire was attached to the microstrip using a ball bond. Using a reflection coefficient of −15 dB as the upper limit to establish the cut-off frequency, the wire having a length of 5 mils had a cut-off frequency of 47.0 GHz (frequency response trace 128), the wire having a length of 8 mils had a cut-off frequency of 27.0 GHz (frequency response trace 130), the wire having a length of 12 mils had a cut-off frequency of 12.0 GHz (frequency response trace 132), and the wire having a length of 15 mils had a cut-off frequency of 10.0 GHz (frequency response trace 134). We can see from the simulation that 8 mils is too long if the higher than 27 GHz frequency bands are considered.

Simulation 2

Figure 4:
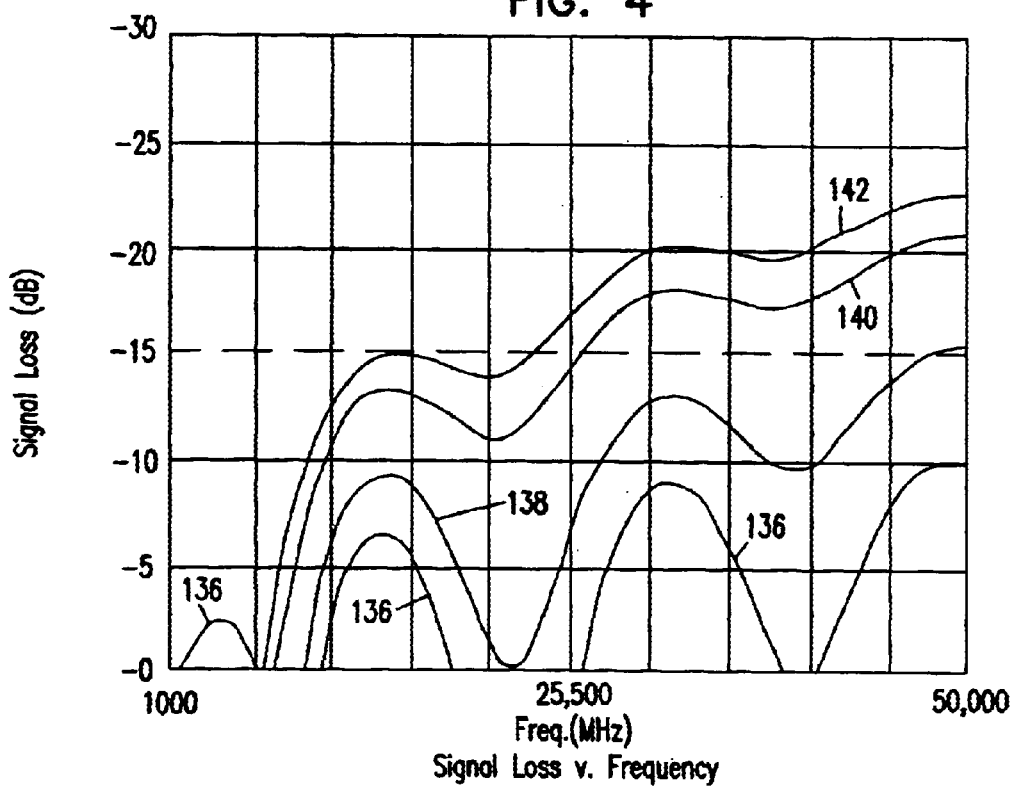

Referring to the chart set forth in FIG. 4, a 50 Ω microstrip line is mounted on a GaAs die having a thickness of 2.5 mils. The die was mounted on a test board on which a circuit having a bonding pad, an input, and an output. The impedance of the circuit on the test board substantially matched the impedance of the microstrip and was 50 Ω. The microstrip was electrically connected to the bonding pad by different types of bonds, including a ball-bond, a wedge bond, a ribbon bond, and a stack-capacitor bond in which a wire is attached to the top portion of a DC block capacitor and to the microstrip as illustrated in FIGS. 1A and 1B. The bottom portion of the DC block capacitor is then mounted on and in electrical communication with the bonding pad. The wire for the ball and wedge bonds has a diameter of 1 mil, the wire for the ribbon bond had a thickness of 1 mil and a width of 2 mils. The wires and ribbons connected directly to the microstrip had a length of 10 mils. The wire connected to the block capacitor had a length of 6 mils.

Using a reflection coefficient of −15 dB as the upper limit to establish the cut-off frequency, the wire attached to the DC block capacitor and to the die using a ball bond had a cut-off frequency greater than 50.0 GHz (frequency response trace 136), the ribbon attached directly to the microstrip and to the die using a ribbon bond had a cut-off frequency of 47.0 GHz (frequency response trace 138), the wire attached directly to the microstrip and to the die using a wedge bond had a cut-off frequency of 26.2 GHz (frequency response trace 140), and the wire attached directly to the microstrip and to the die using a ball bond had a cut-off frequency of 23.2 GHz (frequency response trace 142).

Simulation 3

Figure 5:
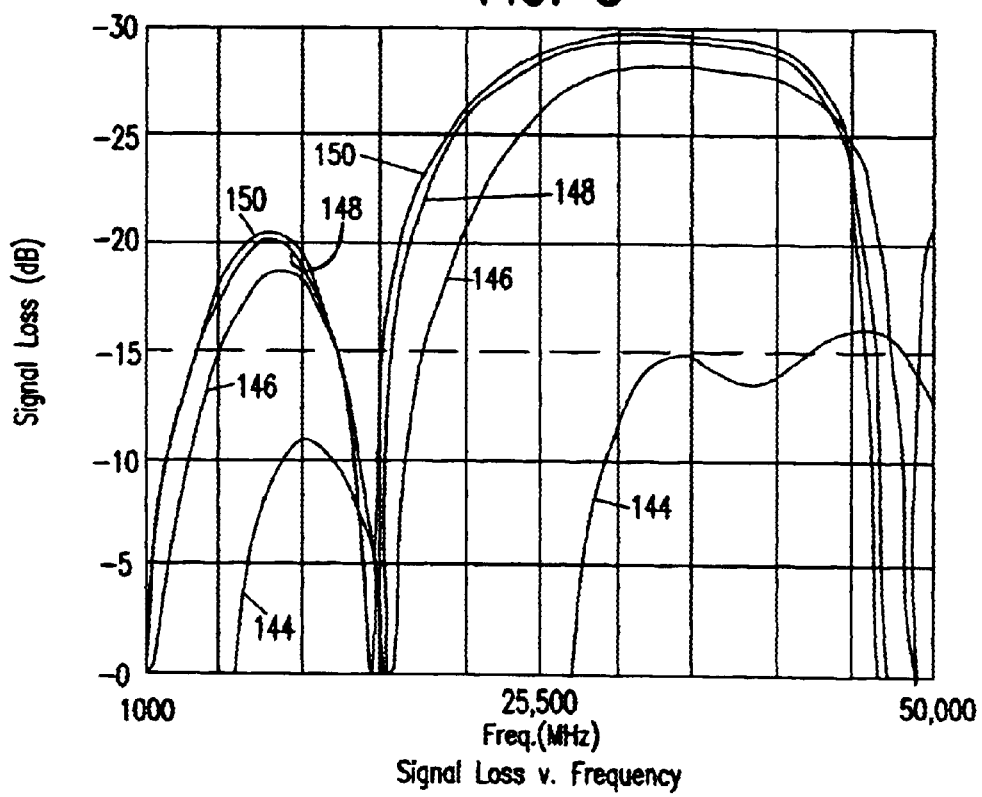

Referring to the chart set forth in FIG. 5, a 50 Ω microstrip line is mounted on a SiGe die having a thickness of 10 mils. The die was mounted on a test board on which a circuit having a bonding pad, an input, and an output. The impedance of the circuit on the test board substantially matched the impedance of the microstrip and was 50 Ω. Additionally, the die was a co-planer type of circuit and two bonds were used to connect the die to a grounding strip on the test board. The microstrip was connected to the bonding pad by different types of bonds, including a ball-bond, a wedge bond, a ribbon bond, and a stack-capacitor bone in which a wire is attached to the top portion of a DC block capacitor and to the top portion of a die using a ball bond as illustrated in FIGS. 1A and 1B. The bottom portion of the DC block capacitor is then mounted on and in electrical communication with the bonding pad.

The wire for the ball and wedge bonds has a diameter of 1 mil, the wire for the ribbon bond had a thickness of 1 mil and a width of 2 mils. The wires and ribbons connected directly to the microstrip had a length of 17 mils. The wire connected to the DC block capacitor had a length of 6 mils.

Using a reflection coefficient of −15 dB at the upper limit to establish the cut-off frequency, the wire attached to the block capacitor and to the die using a ball bond had a cut-off frequency of 42.0 GHz (frequency response trace 144), the ribbon attached directly to the microstrip and to the die using a ribbon bond had a cut-off frequency of 5.6 GHz (frequency response trace 146), the wire attached directly to the microstrip and to the die using a wedge bond had a cut-off frequency of 4.4 GHz (frequency response trace 148), and the wire attached directly to the microstrip and to the die using a ball bond had a cut-off frequency of 4.1 GHz (frequency response trace 150).

If a reflection coefficient of −10 dB is used to establish the cut-off frequency the frequency response improves as follows. The wire attached to the block capacitor and to the die using a ball bond had a cut-off frequency greater than 50 GHz (frequency response trace 144), the ribbon attached directly to the microstrip and to the die using a ribbon bond had a cut-off frequency of about 20 GHz (frequency response trace 146), the wire attached directly to the microstrip and to the die using a wedge bond had a cut-off frequency of about 17 GHz (frequency response trace 148), and the wire attached directly to the microstrip and to the die using a ball bond had a cut-off frequency of about 17 GHz (frequency response trace 150).

Experiment 1

Figure 6A:
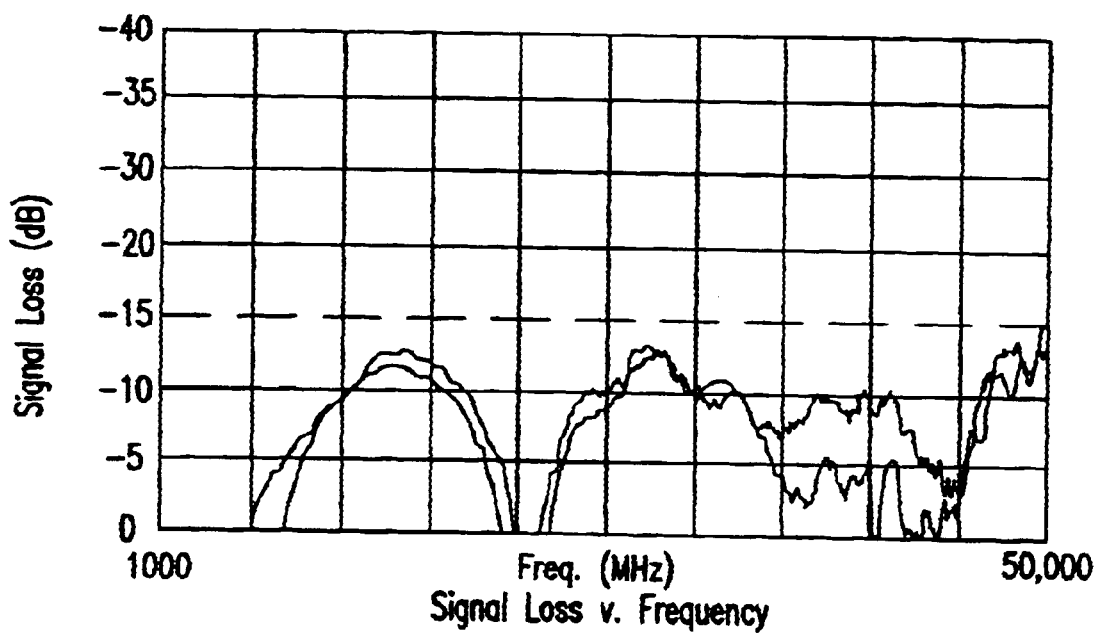
FIG. 6A is a graph illustrating an experiment that demonstrates the performance of a circuit that embodies the present invention.
Figure 6B:
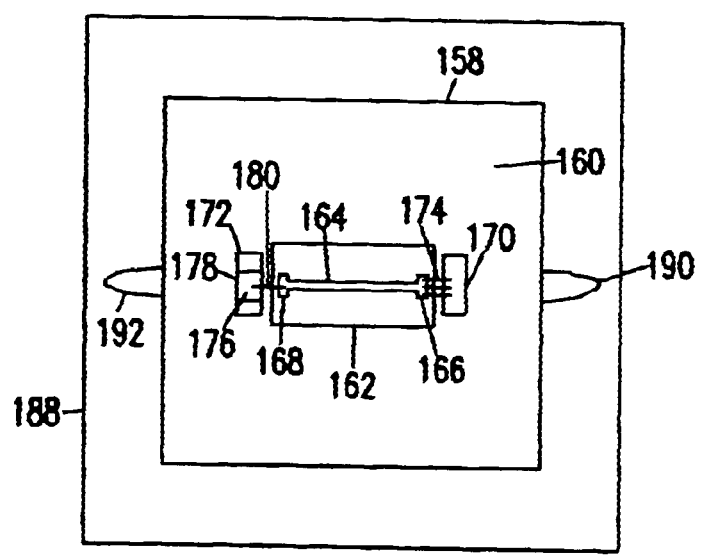
FIG. 6B illustrates the circuit used in the experiment in which the graph shown in FIG. 6A was generated.

Referring to FIGS. 6A and 6B, an experiment was conducted in which a test package 158 was mounted on a circuit board. The test package 158 was formed by a laminate substrate 160. A die 162 having a thickness of 5 mils is mounted on the substrate 160. A microstrip 164 having an impedance of 50 Ω is mounted on the die 162 and has first and second ends 166 and 168. Two bonding pads 170 and 172 also are mounted on the laminate substrate 160. The first end 166 of the microstrip 164 is connected to the first bonding pad 170 with three wires 174 to minimize the distribute inductance. Each of the three wires 174 had a length of 10 mils. The second end 168 of the microstrip 164 was connected to a top portion 176 of a DC block capacitor 178 having a capacitance of 100 pf with a wire 180 having a length of about 6 mils. The wire 180 was connected to the second end 168 of the microstrip 164 with a ball bond. The ball bond had a thickenss in the range of about 1.5 mils to about 2 mils. The capacitor 178 had a thickness of 7 mils and a bottom portion mounted on and in electrical communication with the second bonding pad 172.

The laminate substrate 160 was mounted on a test board 188 having a first printed trace 190 forming an input port and a second printed trace 192 having an output port. The first bonding pad 170 is in electrical communication with the first trace 190 through a via, and the second bonding pad 172 is in electrical communication with the second trace 192 through a via. A signal was then conducted from the input to the output. Trace 184 represents the measured frequency response at the input, and trace 186 represents the measured frequency response at the output. Using a reflection coefficient of −15 dB at the upper limit to establish a cut-off frequency, the circuit used in this experiment demonstrated good performance up to at least 50 GHz.

Figure 7:
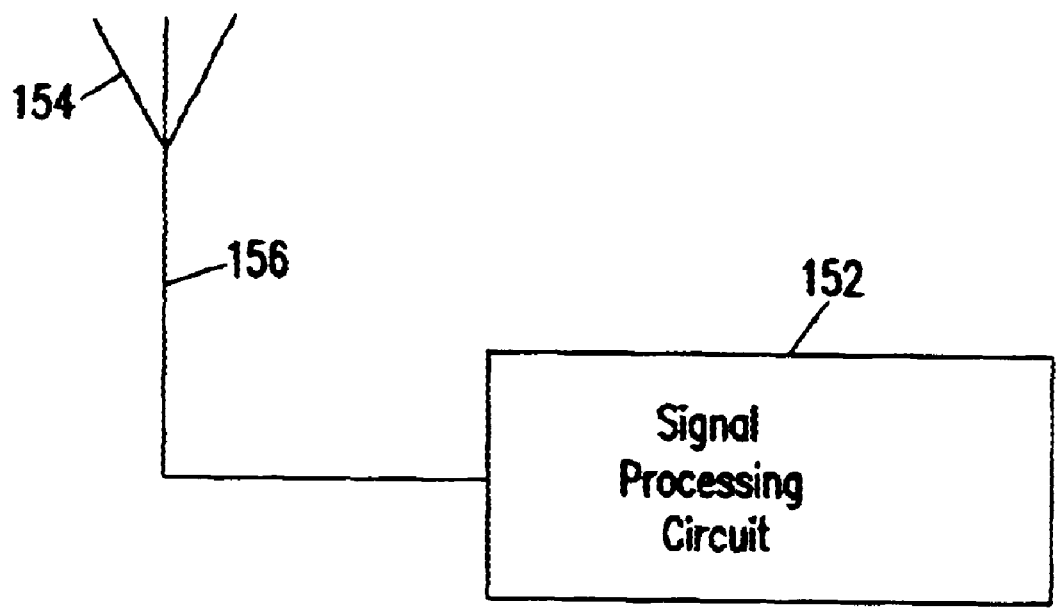
FIG. 7 is a circuit diagram of one possible system that embodies the present invention.

Referring now to FIG. 7, one possible application for connecting a die and discrete electrical component as described herein includes a system for transmitting and/or receiving high-frequency RF signals through an antenna 154. A signal processing circuit 152 is in electrical communication with the antenna 154 via a signal path 156. The signal processing circuit 152 includes a variety of electrical components (not shown) mounted on a circuit board such as low noise amplifiers, power amplifiers, oscillators, mixers, and intermediate filters. At least some of these components are mounted on a die and use an intermediate signal path and discrete electrical component to translate the signal from the die to a trace on the circuit board as illustrated in FIGS. 1A and 1B.

Examples of such applications include processing signals for a variety of applications such as stationary applications, hand-held applications, and mobile applications. More specific examples include voice communications such as mobile telephones; two-way radios; digital radios; satellite links and data transmission; wireless network connections, including wireless Internet connections; wireless modems; vehicle-mounted radar for collision prevention and vehicle speed control; and any other application in which high-frequency signals are processed.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. An apparatus for processing high frequency signals, the apparatus comprising:
   an electrical circuit, the electrical circuit having a top portion and a contact point positioned on the top portion;
   a discrete electrical component, the discrete electrical component having a top portion and a contact point positioned on the top portion;
   an intermediate signal path, the intermediate signal path extending between the contact point on the top portion of the electrical circuit and the contact point on the top portion of the discrete electrical component; and
   a substrate having a surface, the electrical circuit and the discrete electrical component being mounted on the surface of the substrate, the surface of the substrate being spaced from the top portion of the discrete electrical component and from the top portion of the electrical circuit, the discrete electrical component providing a signal path between the intermediate signal path and the substrate.

2. The apparatus of claim 1 wherein the intermediate signal path includes a wire, the wire having a length in the range of about 2 mils and about 12 mils.

3. The apparatus of claim 2 wherein:
   the substrate is formed with a circuit board; and
   the wire lies in a first plane and the circuit board lies in a second plane, the first plane being substantially parallel to the second plane.

4. The apparatus of claim 1 wherein the electrical circuit is configured to process an electrical signal having a frequency in the range of about 20 GHz and higher with a reflection coefficient of about −15 dB or less.

5. The apparatus of claim 4 wherein the electrical circuit is configured to process an electrical signal having a frequency in the range of about 27 GHz to about 32 GHz with a reflection coefficient of about −15 dB or less.

6. The apparatus of claim 1 wherein the discrete electrical component is a capacitor.

7. The apparatus of claim 1 wherein the discrete electrical component is a conductive member.

8. The apparatus of claim 1 wherein the electrical circuit is fabricated in a die.

9. The apparatus of claim 8 wherein the die is formed using SiGe.

10. The apparatus of claim 8 wherein the electrical circuit is a microwave monolithic integrated circuit (MMIC).

11. The apparatus of claim 10 wherein the intermediate signal path is attached to the contact point with a structure selected from the group consisting essentially of: a ball bond, a wedge bond, and a ribbon bond.

12. The apparatus of claim 10 further comprising:
    an antenna in electrical communication with the electrical circuit and the discrete electrical component.

13. The apparatus of claim 1 wherein the surface is substantially planer.

14. The apparatus of claim 13 wherein the substrate is a circuit board.

15. An apparatus for processing high frequency signals, the apparatus comprising:

a circuit board, the circuit board including an electrical circuit and a discrete electrical component; and a wire extending between the electrical circuit and the discrete electrical component, the wire not having direct contact with the circuit board, and the wire and discrete electrical component forming a signal path between the electrical circuit and the circuit board.

16. The apparatus of claim 15 wherein the wire has a length in the range of about 2 mils and about 10 mils.

17. The apparatus of claim 16 wherein:

the electrical circuit and the discrete electrical component are mounted on a circuit board; and the wire lies in a first plane and the circuit board lies in a second plane, the first plane being substantially parallel to the second plane.

18. The apparatus of claim 15 wherein the electrical circuit is configured to process an electrical signal having a frequency that is in the range of about 20 GHz and higher with a reflection coefficient of about −15 dB or less.

19. The apparatus of claim 18 wherein the electrical circuit is configured to process an electrical signal having a frequency in the range of about 27 GHz to about 32 GHz with a reflection coefficient of about −15 dB or less.

20. The apparatus of claim 15 wherein the discrete electrical component is selected from the group consisting essentially of: capacitor, metalized bar for grounding, and metalized chip for establishing a signal path.

21. The apparatus of claim 15 wherein the electrical circuit is fabricated in a die.

22. The apparatus of claim 21 wherein the die is formed using SiGe.

23. The apparatus of claim 21 wherein the electrical circuit is a microwave monolithic integrated circuit (MMIC).

24. The apparatus of claim 23 wherein the wire is attached to the contact point with a structure selected from the group consisting essentially of: a ball bond, a wedge bond, and a ribbon bond.

25. The apparatus of claim 15 further comprising:

an antenna in electrical communication with the electrical circuit, the discrete electrical component, and the wire.

26. An apparatus for processing high frequency signals, the apparatus comprising:

a circuit board, the circuit board including an electrical circuit and a discrete electrical component, the electrical circuit being fabricated in a die the contact point being formed in a top portion of the die; and a wire extending between the electrical circuit and the discrete electrical component, the wire not having direct contact with the circuit board, the wire being attached to the contact point with a ball bond, and the thickness of the discrete electrical component being about the same as the combined thickness of the die and the ball bond.

27. A method of manufacturing electronics, the electronics being mounted on a circuit board having a surface, the method comprising:

mounting an electrical circuit to the circuit board, the electrical circuit having a contact point elevated off the surface of the circuit board;

mounting a discrete electrical component on the circuit board, the discrete electrical component having a contact point elevated off the surface of the circuit board; and positioning a conductive path between the contact of the electrical circuit and the discrete electrical component, the conductive path and the discrete electrical component forming a signal path between the electrical circuit and the circuit board.

28. The method of claim 27 wherein the act of positioning a conductive path includes positioning a wire between the contact of the electrical circuit and the discrete electrical component.

29. The method of claim 28 wherein the act of positioning a wire includes positioning a wire having a length in the range of about 2 mils and about 12 mils.

30. The method of claim 28 wherein the wire has first and second ends and the act of positioning a wire further includes bonding the first end of the wire to the electrical circuit using a bond selected from the group consisting essentially of: a ball bond, a wedge bond, and a ribbon bond.

31. The method of claim 30 wherein the act of positioning the wire further includes positioning the first end of the wire about the same distance from the circuit board as the second end of the wire.

32. The method of claim 28 wherein the discrete electrical component is a capacitor and the act of positioning the wire includes positioning the wire between the electrical circuit and the capacitor.

33. A method of processing a high frequency electrical signal, the method comprising:

conducting the electrical signal through an electrical circuit, the electric circuit being mounted on a circuit board, the electrical signal having a frequency in the range of about 20 GHz and higher with a reflection coefficient of about −15 dB or less;

directly conducting the electrical signal from the electrical circuit to an intermediate signal path at a contact point physically isolated from the circuit board; and directly conducting the electrical signal from the intermediate signal path to a discrete electrical component at a contact point physically isolated from the circuit boards, and from the contact point physically isolated from the circuit board to the circuit board.

34. The method of claim 33 wherein:

the act of directly conducting the electrical signal from the electrical circuit to an intermediate signal path includes conducting the electrical signal from the electrical circuit to a wire; and the act of directly conducting the electrical signal from the intermediate signal path to a discrete electrical component includes conducting the electrical signal from the wire to the discrete electrical component.

35. The method of claim 34 wherein the act of conducting the electrical signal along the intermediate signal path between the electrical circuit and the discrete electrical component at a frequency in the range of about 27 GHz to about 32 GHz with a reflection coefficient of about −15 dB or less.

36. The method of claim 34 wherein the act of conducting the electrical signal along the intermediate signal path between the electrical circuit and the discrete electrical component for a distance in the range between about 2 mils and about 12 mils.

37. A method of processing a high frequency electrical signal, the method comprising:

conducting the electrical signal through an electrical circuit, the electric circuit being mounted on a circuit board, the electrical signal having a frequency in the range of about 20 GHz and higher with a reflection coefficient of about −15 dB or less, wherein the circuit board includes a trace;

directly conducting the electrical signal from the electrical circuit to an intermediate signal path at a contact point physically isolated from the circuit board, wherein the discrete electrical component is a capacitor mounted on the trace; and conducting the electrical signal from the intermediate signal path, through the capacitor, and to the trace.

38. The method of claim 37 wherein the electrical circuit is a microwave monolithic integrated circuit (MMIC), the method further comprising:

conducting the electrical signal through the MMIC to the wire.

39. The method of claim 38 further comprising:

converting the electrical signal to a radio signal; and transmitting the radio signal.

40. An apparatus for processing high frequency signals, the apparatus comprising:

an electrical circuit, the electrical circuit having a top portion and a contact point positioned on the top portion the electrical circuit, the electrical circuit being fabricated in a die, and the contact point being formed in a top portion of the die;

a discrete electrical component, the discrete electrical component having a top portion and a contact point positioned on the top portion;

an intermediate signal path, the intermediate signal path extending between the contact point on the top portion of the electrical circuit and the contact point on the top portion of the discrete electrical component, the intermediate signal path being attached to the contact point with a ball bond, the thickness of the discrete electrical component being about the same as the combined thickness of the die and the ball bond; and a substrate having a surface, the electrical circuit and the discrete electrical component being mounted on the surface of the substrate, the surface of the substrate being spaced from the top portion of the discrete electrical component and from the top portion of the electrical circuit.

41. An apparatus for processing high frequency signals, the apparatus comprising:

a circuit board having a trace;

an electrical circuit fabricated on a die, the die being mounted on the circuit board and having a top portion and a contact point positioned on the top portion, the circuit being configured to process a signal having a frequency in the range of about 20 GHz and higher with a reflection coefficient of about −15 dB or less;

a capacitor mounted on the circuit board, the capacitor having a top portion and bottom portion, the bottom portion opposing the trace; and a wire, the wire extending between the contact point on the top portion of the die and the top portion of the capacitor, the wire having a length in the range of about 2 mils to about 12 mils.

* * * * *